US005538685A

United States Patent [19]

Toyofuku et al.

[11] Patent Number: 5,538,685
[45] Date of Patent: Jul. 23, 1996

[54] PALLADIUM BONDING WIRE FOR SEMICONDUCTOR DEVICE

[75] Inventors: Katsuyuki Toyofuku; Ichiro Nagamatsu; Shinji Shirakawa; Hiroto Iga; Takeshi Kujiraoka; Kensei Murakami, all of Tokyo, Japan

[73] Assignee: Tanaka Denshi Kogyo Kabushiki Kaisha, Tokyo, Japan

[21] Appl. No.: 453,999

[22] Filed: May 30, 1995

Related U.S. Application Data

[60] Continuation of Ser. No. 171,698, Dec. 22, 1993, abandoned, which is a division of Ser. No. 708,204, May 31, 1991, Pat. No. 5,298,219.

[30] Foreign Application Priority Data

Jun. 4, 1990 [JP] Japan ................................. 2-146498
Jun. 4, 1990 [JP] Japan ................................. 2-146499

[51] Int. Cl.$^6$ ................................................ C22C 5/04
[52] U.S. Cl. .................... 420/463; 420/464; 420/465; 437/209
[58] Field of Search ................................ 420/463, 464, 420/465; 437/209 WB; 148/430, 405

[56] References Cited

U.S. PATENT DOCUMENTS

| 4,836,984 | 6/1989 | Wagner et al. | 420/464 |
| 4,917,861 | 4/1990 | Schaffer et al. | 420/464 |
| 5,402,305 | 3/1995 | Asada et al. | 420/463 |

FOREIGN PATENT DOCUMENTS

| 56-049535 | 5/1981 | Japan . | |
| 56-88329 | 7/1981 | Japan . | |
| 56-88328 | 7/1981 | Japan . | |
| 64-087735 | 3/1989 | Japan | C22C 5/04 |
| 01-180962 | 7/1989 | Japan | C22C 5/04 |
| 3156936 | 7/1991 | Japan . | |
| 05-009625 | 1/1993 | Japan | C22C 5/04 |

OTHER PUBLICATIONS

"Gold Wire for Automated Bonding," Bruce L. Gehman, Electronics Materials Division, Cominco American Incorporated, Spokane, Washington. Mar. 1980, pp. 84–91.
Binary Alloy Phase Diagrams; vol. 1 ed by Thaddeus Massalshi p. 632, 1986.

*Primary Examiner*—David A. Simmons
*Assistant Examiner*—Margery S. Phipps
*Attorney, Agent, or Firm*—Greenblum & Bernstein

[57] ABSTRACT

A bonding wire for a semiconductor device contains high purity Pd or Pd alloy as a base metal and 25–10000 atppm of low boiling element III having a boiling point lower than a melting point of the base metal and soluble in Pd, or contains high purity Pd or Pd alloy as a base metal and 5–500 atppm of low boiling point element IV having a boiling point lower than a melting point of the base metal and insoluble in Pd, or high purity Pd or Pd alloy as a base metal, and 5–10000 atppm of low boiling point element III and low boiling point element IV, the low boiling point element III having a boiling point lower than a melting point of the base metal and being soluble in Pd, the low boiling point element IV having a boiling point lower than a melting point of the base metal and being insoluble in Pd, the low boiling elements III and IV being present in a concentration so that (content of the low boiling point element III)/25 + (content of the low boiling element IV)/5 $\geq$ 1 $\geq$ (content of the low boiling element III)/10000 + (content of the low boiling element IV)/500. The low boiling point elements III and IV may be replaced by low boiling point element I soluble in Au and low boiling point element II soluble in Au, respectively.

13 Claims, No Drawings

PALLADIUM BONDING WIRE FOR SEMICONDUCTOR DEVICE

This application is a continuation of application No. 08/171,698, filed Dec. 22, 1993, now abandoned, which is a divisional of application Ser. No. 07/708,204, filed May 31, 1991, now U.S. Pat. No. 5,298,219.

BACKGROUND OF THE INVENTION

The present invention relates to a bonding wire for a semiconductor device adapted to be used for connection between a chip electrode of the semiconductor device and an external lead, and more particularly to such a bonding wire suitable for a ball bonding process.

It is known that a chip electrode of a semiconductor device is connected through a bonding wire such as Au wire to an external lead by melting a tip of the Au wire depending from an end of a capillary by means of an electrical torch to form a ball at the tip of the Au wire, pressing the ball against the chip electrode to bond together, then leading the Au wire to the external lead so as to form a loop, bonding the loop to the external lead, and finally cutting the Au wire.

In such a conventional bonding wire for a semiconductor device, however, a neck portion formed immediately above the ball is influenced by heat upon formation of the ball to relax a stress accumulated in the wire. Accordingly, a mechanical strength of the neck portion becomes lower than that of the base wire not influenced by heat. As the result, the neck portion is ruptured, or wire falling or wire sagging is generated during bonding work. Furthermore, in temperature cycle life test of products, a stress is generated by heat expansion and contraction due to repeated temperature change, and the stress is concentrated at the neck portion, causing a problem that the rupture of the neck portion is easily generated.

Meanwhile, in recent years, high-density mounting of LSI has accompanied a marked tendency to provide a multiplicity of pins. In this circumstance, it is demanded to reduce a diameter of the bonding wire and thereby reduce a bonding pitch.

However, as the neck portion of the aforementioned bonding wire is easy to rupture, it is impossible to reduce the diameter of the bonding wire, and the above demand cannot accordingly be met.

SUMMARY OF THE INVENTION

It is accordingly an object of the present invention to make the strength of the neck portion equal to or more than that of the base wire.

According to a first aspect of the present invention to achieve the above object, there is provided a bonding wire for a semiconductor device, containing high purity Au or Au alloy as a base metal and 25– 10000 atppm of low boiling point element I having a boiling point lower than a melting point of the base metal and soluble in Au, or there is provided a bonding wire for a semiconductor device, containing high purity Au or Au alloy as a base metal and 500 atppm of low boiling point element II having a boiling point lower than a melting point of said base metal and insoluble in Au, or there is provided a bonding wire for a semiconductor device, containing high purity Au or Au alloy as a base metal and 5–10000 atppm of a mixture of low boiling point element I having a boiling point lower than a melting point of the base metal and soluble in Au and low boiling point element II having a boiling point lower than the melting point of the base metal and insoluble in Au under the condition of (content of the low boiling point element I)/25+ (content of the low boiling point element II)/5 $\geq$ 1 $\geq$ (content of the low boiling point element I)/10000 + (content of the low boiling point element II)/500.

The aforementioned high purity Au contains 99.99% or more of Au and a residual amount of unavoidable impurities.

The aforementioned Au alloy contains the high purity Au and at least one of Pd, Ag (20 at % or less), Pt (10 at % or less), Rh (2 at % or less), Os, Ru (1 at %), Be, Ca, Ge, Y, La, Mg, Zr, Ga, In, Mo, Re, Cu, Fe (1 atppm–8 at %). The use of this Au alloy improves the mechanical strength of the base metal itself at ordinary temperatures and high temperatures to thereby enable high-speed bonding, and also prevents enlargement of crystal grain in the neck portion upon formation of the ball.

The low boiling point element I having a boiling point lower than the melting point of the base metal and soluble in Au contains at least one of Zn, Cd, Hg, Te, etc., while the low boiling point element II having the boiling point lower than the melting point of the base metal and insoluble in Au contains at least one of P, S, As, Se, Rb, Cs, etc.

According to a second aspect of the present invention achieving the above object, there is provided a bonding wire for a semiconductor device, containing high purity Pd or Pd alloy as a base metal and 25–10000 atppm of low boiling point element III having a boiling point lower than a melting point of the base metal and soluble in Pd, or there is provided a bonding wire for a semiconductor device, containing high purity Pd or Pd alloy as a base metal and 5–500 atppm of low boiling point element IV having a boiling point lower than a melting point of the base metal and insoluble in Pd, or there is provided a bonding wire for a semiconductor device, containing high purity Pd or Pd alloy as a base metal and 5–10000 atppm of a mixture of low boiling point element III having a boiling point lower than a melting point of the base metal and soluble in Pd and low boiling point element IV having a boiling point lower than the melting point of the base metal and insoluble in Pd under the condition of (content of the low boiling point element III)/25 + (content of the low boiling point element IV)/5 $\geq$ 1 $\geq$ (content of the low boiling point element III)/10000 + (content of the low boiling point element IV)/500.

The aforementioned high purity Pd contains 99.9% or more of Pd and a residual amount of unavoidable impurities.

The aforementioned Pd alloy contains the high purity Pd and at least one of Au (10 at % or less), Ag (5 at % or less), Pt (20 at % or less), Rh (8 at % or less), Ru, Os, Ir (1 at % or less), Cu, Mo, Fe, Ti (1 atppm–5 at %). The use of this Pd alloy improves a mechanical strength of the base metal itself at ordinary temperatures and high temperatures to thereby enable high-speed bonding, and also prevents enlargement of crystal grain in the neck portion upon formation of the ball.

The low boiling point element III having the boiling point lower than the melting point of the base metal and soluble in Pd contains at least one of Zn, Cd, Hg, Li, Mg, Te, Yb, etc., while the low boiling point element IV having the boiling point lower than the melting point of the base metal and insoluble in Pd contains at least one of P, S, As, Tl, etc.

The content of each component of the bonding wire for the semiconductor device according to the present invention is limited for the following reasons.

The low boiling point element having the boiling point lower than the melting point of the base metal is vaporized and scattered from the molten ball upon formation thereof. However, the low boiling point element cannot be vaporized from the neck portion, but it tends to be vaporized in the neck portion to generate a stress. Above all, the low boiling point element I soluble in Au is hard to escape from Au. Accordingly, if the content of the low boiling point element I is less than 25 atppm, a satisfactory characteristic cannot be obtained. In contrast, if the content of the low boiling point element I is more than 10000 atppm, embrittlement of the base wire appears to cause difficulty in wire drawing. Moreover, an amount of the element I not scattered from the ball but residing in the ball upon formation of the ball becomes large to excessively harden the ball, causing chip cracking upon bonding. For the above reasons, the content of the low boiling point element I needs to be set in the range of 25–10000 atppm.

On the other hand, the low boiling point element II insoluble in Au is easy to escape from Au. Accordingly, if the content of the low boiling point element II is less than 5 atppm, a satisfactory characteristic cannot be obtained. In contrast, if the content of the low boiling point element II is more than 500 atppm, embrittlement of the base wire appears to cause difficulty in wire drawing. Moreover, an amount of the element II not scattered from the ball but residing in the ball upon formation of the ball becomes large to excessively harden the ball, causing chip cracking upon bonding. For the above reasons, the content of the low boiling point element II needs to be set in the range of 5–500 atppm.

Under the condition of (content of the low boiling point element I)/25 + (content of the low boiling point element II)/5 $\geq$ 1, if a lower limit of the total content of the low boiling point element I soluble in Au and the low boiling point element II insoluble in Au is less than 5 atppm, a satisfactory characteristic cannot be obtained. Therefore, the lower limit of the total content of both the elements I and II under the above condition needs to be set to 5 atppm.

Further, under the condition of (content of the low boiling point element I)/10000 + (content of the low boiling point element II)/500$\leq$1, if an upper limit of the total content of the low boiling point element I soluble in Au and the low boiling point element II insoluble in Au is more than 10000 atppm, embrittlement of the base wire appears to cause difficulty in wire drawing. Moreover, an amount of the element I and II not scattered from the ball but residing in the ball upon formation of the ball becomes large to excessively harden the ball, causing chip cracking upon bonding. Therefore, the upper limit of the total content of both elements I and II needs to be set to 10000 atppm.

Consequently, the bonding wire of the present invention contains high purity Au or Au alloy as a base metal and 25–10000 atppm of low boiling point element I having a boiling point lower than a melting point of said base metal and soluble in Au, or contains high purity Au or Au alloy as a base metal and 5–500 atppm of low boiling point element II having a boiling point lower than a melting point of the base metal and insoluble in Au, or contains high purity Au or Au alloy as a base metal and 5–10000 atppm of a mixture of low boiling point element I having a boiling point lower than a melting point of the base metal and soluble in Au and low boiling point element II having a boiling point lower than the melting point of the base metal and insoluble in Au under the condition of (content of said low boiling point element I)/25 + (content of said low boiling point element II)/5$\geq$1$\geq$ (content of said low boiling point element I)/10000 + (content of said low boiling point element II)/500. With this constitution, the low boiling point element in the ball is vaporized and scattered upon formation of the ball to thereby prevent gas absorption peculiar to metal and obtain a ball satisfactory for bonding. On the other hand, the low boiling point element in the neck portion cannot be vaporized from the surface thereof, but it tends to be vaporized in the neck portion to generate a stress. Accordingly, a rupture strength of the neck portion after bonding is improved as compared with that of the base wire generating no stress.

The low boiling point element having a boiling point lower than the melting point of the base metal is vaporized and scattered from the molten ball upon formation thereof. However, the low boiling point element cannot be vaporized from the neck portion, but it tends to be vaporized in the neck portion to generate a stress. Above all, the low boiling point element III soluble in Pd is hard to escape from Pd. Accordingly, if the content of the low boiling point element III is less than 25 atppm, a satisfactory characteristic cannot be obtained. In contrast, if the content of the low boiling point element III is more than 10000 atppm, embrittlement of the base wire appears to cause difficulty in wire drawing. Moreover, an amount of the element III not scattered from the ball but residing in the ball upon formation of the ball becomes large to excessively harden the ball, causing chip cracking upon bonding. For the above reasons, the content of the low boiling point element III needs to be set in the range of 25–10000 atppm.

On the other hand, the low boiling point element IV insoluble in Pd is easy to escape from Pd. Accordingly, if the content of the low boiling point element IV is less than 6 atppm, a satisfactory characteristic cannot be obtained. In contrast, if the content of the low boiling point element IV is more than 500 atppm, embrittlement of the base wire appears to cause a difficulty of wire drawing. Moreover, an amount of the element IV not scattered from the ball but residing in the ball upon formation of the ball becomes large to excessively harden the ball, causing chip cracking upon bonding. For the above reasons, the content of the low boiling point element IV needs to be set in the range of 5–500 atppm.

Under the condition of (content of said low boiling point element III)/25 + (content of said low boiling point element IV)/5$\geq$1, if a lower limit of the total content of the low boiling point element III soluble in Pd and the low boiling point element IV insoluble in Pd is less than 5 atppm, a satisfactory characteristic cannot be obtained. Therefore, the lower limit of the total content of both the elements III and IV under the above condition needs to be set to 5 atppm.

Further, under the condition of (content of the low boiling point element III)/10000 + (content of the low boiling point element IV)/500$\leq$1, if an upper limit of the total content of the low boiling point element III soluble in Pd and the low boiling point element IV insoluble in Pd is more than 10000 atppm, embrittlement of the base wire appears to cause difficulty in wire drawing. Moreover, an amount of the element III and IV not scattered from the ball but residing in the ball upon formation of the ball becomes large to excessively harden the ball, causing chip cracking upon bonding. Therefore, the upper limit of the total content of both the elements III and IV needs to be set to 10000 atppm.

Consequently, the bonding wire of the present invention contains high purity Pd or Pd alloy as a base metal and 25–10000 atppm of low boiling point element III having a boiling point lower than a melting point of said base metal and soluble in Pd, or contains high purity Pd or Pd alloy as a base metal and 5–500 atppm of low boiling point element IV having a boiling point lower than a melting point of said base metal and insoluble in Pd, or contains high purity Pd or Pd alloy as a base metal and 5–10000 atppm of a mixture of low boiling point element III having a boiling point lower than a melting point of said base metal and soluble in Pd and low boiling point element IV having a boiling point lower than the melting point of the base metal and insoluble in Pd under the condition of (content of the low boiling point element III)/25 + (content of the low boiling point element IV)/5$\geq$1$\geq$ (content of the low boiling point element III)/10000 + (content of the low boiling point element IV)/500. With this constitution, the low boiling point element in the ball is vaporized and scattered upon formation of the ball to thereby prevent gas absorption peculiar to metal and obtain the ball satisfactory for bonding. On the other hand, the low boiling point element in the neck portion cannot be vaporized from the surface thereof, but it tends to be vaporized in the neck portion to generate a stress. Accordingly, a rupture strength of the neck portion after bonding is improved as compared with that of the base wire generating no stress.

DETAILED DESCRIPTION OF THE PREFERRED EMBODIMENTS

There will now be described some preferred embodiments of the present invention.

In a first preferred embodiment employing high purity Au or Au alloy as the base metal, various samples were prepared in the following manner. As the base metal were used high purity Au having a purity of 99.999%, Au alloy containing the high purity Au and 20 at % of Pd, Au alloy containing the high purity Au and 10 atppm of Be, Au alloy containing the high purity Au and 0.5 at % of Mo, and Au alloy containing the high purity Au and 8 at % of Cu. Then, at least one of Zn, Cd, Hg, P and Rb was added to the high purity Au and the Au alloys prepared above, and these mixtures were molten to be cast. The castings thus obtained were then subjected to a grooved roll, during which they were annealed. Then, they were subjected to wire drawing, thereby forming base wires each having a diameter of 30 μm. Thereafter, further stress relieving was sufficiently conducted to finally obtain the samples.

The contents of the additional elements in the samples are shown in Table 1. In Table 1, Nos. 1–54 of the samples correspond to the preferred embodiment, and Nos. 55 and 56 of the samples correspond to comparisons departing from the composition range according to the present invention.

TABLE 1

| SAMPLE No. | ADDITIONAL ELEMENT (at ppm) | | | | |
|---|---|---|---|---|---|
| | Zn | Cd | Hg | P | Rb |
| PREFERRED EMBODIMENT | | | | | |
| 1 | 20 | | | | |
| 2 | 25 | | | | |
| 3 | 50 | | | | |
| 4 | 500 | | | | |
| 5 | 5000 | | | | |
| 6 | 10000 | | | | |
| 7 | 11000 | | | | |
| 8 | | 20 | | | |
| 9 | | 25 | | | |
| 10 | | 50 | | | |
| 11 | | 500 | | | |
| 12 | | 5000 | | | |
| 13 | | 10000 | | | |

TABLE 1-continued

| SAMPLE No. | ADDITIONAL ELEMENT (at ppm) | | | | |
|---|---|---|---|---|---|
| | Zn | Cd | Hg | P | Rb |
| 14 | | 11000 | | | |
| 15 | | | 20 | | |
| 16 | | | 25 | | |
| 17 | | | 50 | | |
| 18 | | | 500 | | |
| 19 | | | 5000 | | |
| 20 | | | 10000 | | |
| 21 | | | 11000 | | |
| 22 | | | | 3 | |
| 23 | | | | 5 | |
| 24 | | | | 50 | |
| 25 | | | | 500 | |
| 26 | | | | 600 | |
| 27 | | | | | 3 |
| 28 | | | | | 5 |
| 29 | | | | | 50 |
| 30 | | | | | 500 |
| 31 | | | | | 600 |
| 32 | 10 | 10 | | | |
| 33 | 100 | 100 | | | |
| 34 | 1000 | 1000 | | | |
| 35 | 5000 | 5000 | | | |
| 36 | 6000 | 6000 | | | |
| 37 | 10 | 10 | 10 | | |
| 38 | 100 | 100 | 100 | | |
| 39 | 1000 | 1000 | 1000 | | |
| 40 | 5000 | 5000 | 5000 | | |
| 41 | | | | 2 | 3 |
| 42 | | | | 5 | 5 |
| 43 | | | | 50 | 50 |
| 44 | | | | 100 | 100 |
| 45 | | | | 250 | 250 |
| 46 | | | | 250 | 300 |
| 47 | 10 | | | 2 | |
| 48 | 10 | 10 | | 2 | |
| 49 | | | 10 | 2 | 2 |
| 50 | 10 | | | 250 | 250 |
| 51 | 1000 | 1000 | | 200 | 200 |
| 52 | 1000 | 1000 | 10 | 200 | 200 |
| 53 | 2000 | 2000 | 2000 | 50 | 50 |
| 54 | 3000 | 3000 | 3000 | 50 | 50 |
| COMPARISON | | | | | |
| 55 | Au (99.99) | | | | |
| 56 | Cu (99.9999) | | | | |

By using the above samples, a pull test was carried out given times (n=40), and measurements were carried out for a pull strength, number of times of rupture of the base wire rather than the neck portion, condition of workability, and existence of chip crack. The result of the measurements for the high purity Au and each Au alloy is shown in Table 2.

TABLE 2

| | Au | | | | Au + Pd (20 at %) | | | |
|---|---|---|---|---|---|---|---|---|
| SAMPLE No. | PULL STRENGTH (g) | C MODE RUPTURE (n = 40) | WORKA-BILITY | CHIP CRACK | PULL STRENGTH (g) | C MODE RUPTURE (n = 40) | WORKA-BILITY | CHIP CRACK |
| PREFERRED EMBODIMENT | | | | | | | | |
| 1 | 12.0 | 4 | GOOD | UNOBSERVED | 21.2 | 6 | GOOD | UNOBSERVED |
| 2 | 12.1 | 22 | " | " | 21.3 | 21 | " | " |
| 3 | 12.2 | 21 | " | " | 21.3 | 25 | " | " |
| 4 | 12.8 | 30 | " | " | 21.5 | 28 | " | " |

TABLE 2-continued

| Sample No. | PULL STRENGTH (g) | C MODE RUPTURE (n=40) | WORKA-BILITY | CHIP CRACK | PULL STRENGTH (g) | C MODE RUPTURE (n=40) | WORKA-BILITY | CHIP CRACK |
|---|---|---|---|---|---|---|---|---|
| 5 | 13.0 | 28 | " | " | 21.6 | 30 | " | " |
| 6 | 13.4 | 30 | " | " | 21.6 | 33 | " | " |
| 7 | 13.6 | 31 | BAD | " | 21.7 | 32 | BAD | OBSERVED |
| 8 | 12.1 | 7 | GOOD | " | 21.2 | 6 | GOOD | UNOBSERVED |
| 9 | 12.2 | 21 | " | " | 21.3 | 22 | " | " |
| 10 | 12.4 | 23 | " | " | 21.3 | 22 | " | " |
| 11 | 12.8 | 35 | " | " | 21.5 | 35 | " | " |
| 12 | 13.3 | 36 | " | " | 21.7 | 38 | " | " |
| 13 | 13.5 | 34 | " | " | 21.7 | 30 | " | " |
| 14 | 13.6 | 35 | BAD | " | 21.8 | 31 | BAD | OBSERVED |
| 15 | 12.0 | 9 | GOOD | " | 21.1 | 8 | GOOD | UNOBSERVED |
| 16 | 12.1 | 26 | " | " | 21.2 | 24 | " | " |
| 17 | 12.8 | 33 | " | " | 21.2 | 36 | " | " |
| 18 | 13.4 | 40 | " | " | 21.5 | 38 | " | " |
| 19 | 13.5 | 38 | " | " | 21.7 | 36 | " | " |
| 20 | 13.7 | 35 | " | " | 21.7 | 34 | " | " |
| 21 | 13.7 | 36 | BAD | UNOBSERVED | 21.8 | 37 | BAD | OBSERVED |
| 22 | 12.0 | 13 | GOOD | " | 21.0 | 12 | GOOD | UNOBSERVED |
| 23 | 12.0 | 22 | " | " | 21.0 | 20 | " | " |
| 24 | 12.2 | 33 | " | " | 21.1 | 35 | " | " |
| 25 | 12.5 | 37 | " | " | 21.4 | 37 | " | " |
| 26 | 12.7 | 38 | BAD | " | 21.5 | 34 | BAD | " |
| 27 | 12.0 | 12 | GOOD | " | 21.1 | 12 | GOOD | " |
| 28 | 12.0 | 22 | " | " | 21.1 | 25 | " | " |
| 29 | 12.3 | 35 | " | " | 21.2 | 36 | " | " |
| 30 | 12.4 | 37 | " | " | 21.8 | 38 | " | " |
| 31 | 12.5 | 38 | BAD | " | 21.8 | 38 | BAD | " |
| 32 | 12.1 | 7 | GOOD | " | 21.2 | 7 | GOOD | " |
| 33 | 12.3 | 33 | " | " | 21.4 | 35 | " | " |
| 34 | 13.1 | 37 | " | " | 21.6 | 37 | " | " |
| 35 | 13.5 | 35 | " | " | 21.7 | 33 | " | " |
| 36 | 13.6 | 36 | BAD | " | 21.8 | 34 | BAD | OBSERVED |
| 37 | 12.5 | 28 | GOOD | " | 21.2 | 30 | GOOD | UNOBSERVED |
| 38 | 12.7 | 36 | " | " | 21.3 | 34 | " | " |
| 39 | 13.0 | 30 | " | " | 21.8 | 29 | " | " |
| 40 | 13.8 | 35 | BAD | " | 21.8 | 30 | BAD | OBSERVED |
| 41 | 12.0 | 23 | GOOD | " | 21.1 | 27 | GOOD | UNOBSERVED |
| 42 | 12.1 | 29 | " | " | 21.1 | 31 | " | " |
| 43 | 12.4 | 28 | " | " | 21.4 | 35 | " | " |
| 44 | 12.4 | 36 | " | " | 21.4 | 38 | " | " |
| 45 | 12.5 | 37 | " | " | 21.8 | 36 | " | " |
| 46 | 12.4 | 35 | BAD | UNOBSERVED | 21.8 | 34 | BAD | UNOBSERVED |
| 47 | 12.0 | 12 | GOOD | " | 21.1 | 12 | GOOD | " |
| 48 | 12.1 | 23 | " | " | 21.2 | 21 | " | " |
| 49 | 12.1 | 27 | " | " | 21.2 | 25 | " | " |
| 50 | 12.5 | 36 | BAD | " | 21.6 | 33 | BAD | " |
| 51 | 13.2 | 36 | GOOD | " | 21.6 | 38 | GOOD | " |
| 52 | 13.3 | 35 | BAD | " | 21.6 | 34 | BAD | " |
| 53 | 13.5 | 28 | GOOD | " | 21.8 | 35 | GOOD | " |
| 54 | 13.7 | 29 | BAD | " | 21.8 | 34 | BAD | OBSERVED |

COMPARISON

| | PULL STRENGTH (g) |
|---|---|
| 55 | 12 |
| 56 | 21 |

| | Au + Be (10 at ppm) | | | | Au + Mo (0.5 at %) | | | |
|---|---|---|---|---|---|---|---|---|
| SAMPLE No. | PULL STRENGTH (g) | C MODE RUPTURE (n = 40) | WORKA-BILITY | CHIP CRACK | PULL STRENGTH (g) | C MODE RUPTURE (n = 40) | WORKA-BILITY | CHIP CRACK |

PREFERRED EMBODIMENT

| Sample | PULL STRENGTH (g) | C MODE RUPTURE | WORKA-BILITY | CHIP CRACK | PULL STRENGTH (g) | C MODE RUPTURE | WORKA-BILITY | CHIP CRACK |
|---|---|---|---|---|---|---|---|---|
| 1 | 12.2 | 6 | GOOD | UNOBSERVED | 13.0 | 7 | GOOD | UNOBSERVED |
| 2 | 12.2 | 20 | " | " | 13.1 | 22 | " | " |
| 3 | 12.3 | 22 | " | " | 13.1 | 24 | " | " |
| 4 | 12.9 | 33 | " | " | 13.5 | 27 | " | " |
| 5 | 13.3 | 33 | " | " | 13.6 | 29 | " | " |
| 6 | 13.6 | 34 | " | " | 13.8 | 29 | " | " |
| 7 | 13.7 | 35 | BAD | " | 13.8 | 32 | BAD | OBSERVED |
| 8 | 12.2 | 6 | GOOD | " | 13.1 | 8 | GOOD | UNOBSERVED |
| 9 | 12.2 | 21 | " | " | 13.2 | 23 | " | " |
| 10 | 12.4 | 25 | " | " | 13.2 | 26 | " | " |
| 11 | 13.0 | 35 | " | " | 13.3 | 30 | " | " |
| 12 | 13.5 | 37 | " | " | 13.5 | 33 | " | " |
| 13 | 13.7 | 36 | " | " | 13.6 | 31 | " | " |
| 14 | 13.7 | 35 | BAD | " | 13.8 | 34 | BAD | OBSERVED |
| 15 | 12.3 | 8 | GOOD | " | 13.3 | 11 | GOOD | UNOBSERVED |

TABLE 2-continued

| | Pull Strength (g) | C Mode Rupture (n = 40) | Workability | Chip Crack | Pull Strength (g) | C Mode Rupture (n = 40) | Workability | Chip Crack |
|---|---|---|---|---|---|---|---|---|
| 16 | 12.4 | 27 | " | " | 13.3 | 29 | " | " |
| 17 | 12.5 | 34 | " | " | 13.4 | 30 | " | " |
| 18 | 13.1 | 39 | " | " | 13.5 | 35 | " | " |
| 19 | 13.4 | 39 | " | " | 13.7 | 36 | " | " |
| 20 | 13.7 | 36 | " | " | 13.7 | 35 | " | " |
| 21 | 13.7 | 35 | BAD | OBSERVED | 13.8 | 35 | BAD | OBSERVED |
| 22 | 12.2 | 12 | GOOD | UNOBSERVED | 13.2 | 14 | GOOD | UNOBSERVED |
| 23 | 12.2 | 24 | " | " | 13.2 | 25 | " | " |
| 24 | 12.7 | 36 | " | " | 13.5 | 39 | " | " |
| 25 | 13.3 | 40 | " | " | 13.7 | 39 | " | " |
| 26 | 13.4 | 38 | BAD | " | 13.7 | 38 | BAD | " |
| 27 | 12.3 | 11 | GOOD | " | 13.1 | 13 | GOOD | " |
| 28 | 12.3 | 21 | " | " | 13.1 | 23 | " | " |
| 29 | 13.0 | 28 | " | " | 13.2 | 37 | " | " |
| 30 | 13.5 | 29 | " | " | 13.6 | 36 | " | " |
| 31 | 13.5 | 30 | BAD | " | 13.6 | 36 | BAD | " |
| 32 | 12.7 | 6 | GOOD | " | 13.1 | 7 | GOOD | " |
| 33 | 12.9 | 37 | " | " | 13.2 | 33 | " | " |
| 34 | 13.4 | 38 | " | " | 13.4 | 35 | " | " |
| 35 | 13.7 | 35 | " | " | 13.6 | 22 | " | " |
| 36 | 13.7 | 35 | BAD | " | 13.8 | 36 | BAD | OBSERVED |
| 37 | 12.3 | 25 | GOOD | " | 13.4 | 30 | GOOD | UNOBSERVED |
| 38 | 12.6 | 28 | " | " | 13.5 | 34 | " | " |
| 39 | 13.3 | 30 | " | " | 13.7 | 37 | " | " |
| 40 | 13.8 | 32 | BAD | " | 13.7 | 35 | BAD | OBSERVED |
| 41 | 12.2 | 25 | GOOD | " | 13.1 | 27 | GOOD | UNOBSERVED |
| 42 | 12.2 | 27 | " | " | 13.3 | 28 | " | " |
| 43 | 12.6 | 34 | " | " | 13.4 | 38 | " | " |
| 44 | 12.9 | 39 | " | " | 13.2 | 36 | " | " |
| 45 | 13.5 | 33 | " | " | 13.6 | 35 | " | " |
| 46 | 13.5 | 33 | BAD | UNOBSERVED | 13.6 | 37 | BAD | UNOBSERVED |
| 47 | 12.2 | 12 | GOOD | " | 13.1 | 14 | GOOD | " |
| 48 | 12.3 | 25 | " | " | 13.0 | 27 | " | " |
| 49 | 12.3 | 29 | " | " | 13.1 | 31 | " | " |
| 50 | 13.5 | 35 | BAD | " | 13.4 | 37 | BAD | " |
| 51 | 13.5 | 39 | GOOD | " | 13.6 | 36 | GOOD | " |
| 52 | 13.6 | 36 | BAD | " | 13.5 | 33 | BAD | " |
| 53 | 13.6 | 34 | GOOD | " | 13.7 | 38 | GOOD | " |
| 54 | 13.7 | 37 | BAD | " | 13.8 | 35 | BAD | OBSERVED |

| COMPARISON | PULL STRENGTH (g) | C MODE RUPTURE (n = 40) |
|---|---|---|
| 55 | 12 | 2 |
| 56 | 21 | 2 |

| | Au + Cu (8 at %) | | | |
|---|---|---|---|---|
| SAMPLE No. | PULL STRENGTH (g) | C MODE RUPTURE (n = 40) | WORKABILITY | CHIP CRACK |
| PREFERRED EMBODIMENT | | | | |
| 1 | 21.9 | 5 | GOOD | UNOBSERVED |
| 2 | 22.0 | 21 | " | " |
| 3 | 22.0 | 26 | " | " |
| 4 | 22.2 | 32 | " | " |
| 5 | 22.3 | 36 | " | " |
| 6 | 22.4 | 35 | " | " |
| 7 | 22.5 | 33 | BAD | OBSERVED |
| 8 | 22.0 | 4 | GOOD | UNOBSERVED |
| 9 | 22.1 | 22 | " | " |
| 10 | 22.1 | 23 | " | " |
| 11 | 22.2 | 34 | " | " |
| 12 | 22.4 | 36 | " | " |
| 13 | 22.4 | 36 | " | " |
| 14 | 22.5 | 32 | BAD | OBSERVED |
| 15 | 22.0 | 9 | GOOD | UNOBSERVED |
| 16 | 22.0 | 27 | " | " |
| 17 | 22.1 | 31 | " | " |
| 18 | 22.3 | 38 | " | " |
| 19 | 22.4 | 36 | " | " |
| 20 | 22.5 | 37 | " | " |
| 21 | 22.5 | 33 | BAD | OBSERVED |
| 22 | 22.1 | 10 | GOOD | UNOBSERVED |
| 23 | 22.1 | 33 | " | " |
| 24 | 22.2 | 40 | " | " |
| 25 | 22.5 | 39 | " | " |

TABLE 2-continued

|  | | | | |
|---|---|---|---|---|
| 26 | 22.5 | 39 | BAD | " |
| 27 | 22.1 | 9 | GOOD | " |
| 28 | 22.1 | 30 | " | " |
| 29 | 22.2 | 38 | " | " |
| 30 | 22.4 | 35 | " | " |
| 31 | 22.4 | 35 | BAD | " |
| 32 | 22.1 | 5 | GOOD | " |
| 33 | 22.1 | 34 | " | " |
| 34 | 22.3 | 35 | " | " |
| 35 | 22.4 | 36 | " | " |
| 36 | 22.5 | 34 | BAD | OBSERVED |
| 37 | 22.2 | 23 | GOOD | UNOBSERVED |
| 38 | 22.3 | 30 | " | " |
| 39 | 22.3 | 33 | " | " |
| 40 | 22.3 | 31 | BAD | OBSERVED |
| 41 | 22.1 | 30 | GOOD | UNOBSERVED |
| 42 | 22.2 | 34 | " | " |
| 43 | 22.3 | 38 | " | " |
| 44 | 22.1 | 35 | " | " |
| 45 | 22.4 | 33 | " | " |
| 46 | 22.4 | 35 | BAD | UNOBSERVED |
| 47 | 22.1 | 10 | GOOD | " |
| 48 | 22.0 | 33 | " | " |
| 49 | 22.1 | 32 | " | " |
| 50 | 22.3 | 32 | BAD | " |
| 51 | 22.4 | 35 | GOOD | " |
| 52 | 22.3 | 36 | BAD | " |
| 53 | 22.4 | 38 | GOOD | " |
| 54 | 22.5 | 38 | BAD | OBSERVED |
| COMPARISON | C MODE RUPTURE (n = 40) | | | |
| 55 | 2 | | | |
| 56 | 2 | | | |

As apparent from Table 2, it is appreciated that the number of times of C mode rupture in the pull test by using the samples according to the present invention is larger than that by using the samples in the comparisons departing from the composition range according to the present invention, and that the neck portion is stronger than the other portion of the base wire. Accordingly, it is understood that the above-mentioned composition range according to the present invention is optimum.

In a second preferred embodiment employing high purity Pd or Pd alloy as the base metal, various samples were prepared in the following manner. As the base metal were used high purity Pd having a purity of 99.95%, Pd alloy containing the high purity Pd and 10 at % Au, Pd alloy containing the high purity Pd and 5 atppm of Ag, Pd alloy containing the high purity Pd and 0.5 at % of Mo, and Pd alloy containing the high purity Pd and 6 at % of Cu. Then, at least one of Zn, Cd, Hg, P and S was added to the high purity Pd and the Pd alloys prepared above, and these mixtures were molten to be cast. The castings thus obtained were then subjected to a grooved roil, during which they were annealed. Then, they were subjected to wire drawing, thereby forming base wires each having a diameter of 30 μm. Thereafter, further stress relieving was sufficiently conducted to finally obtain the samples.

The contents of the additional elements in the samples are shown in Table 3. In Table 3, Nos. 1–54 of the samples correspond to the preferred embodiment, and Nos. 55 and 56 of the samples correspond to comparisons departing from the composition range according to the present invention.

TABLE 3

| SAMPLE | ADDITIONAL ELEMENT (at ppm) | | | | |
|---|---|---|---|---|---|
| No. | Zn | Cd | Hg | P | S |
| PREFERRED EMBODIMENT | | | | | |
| 1 | 20 | | | | |
| 2 | 25 | | | | |
| 3 | 50 | | | | |
| 4 | 500 | | | | |
| 5 | 5000 | | | | |
| 6 | 10000 | | | | |
| 7 | 11000 | | | | |
| 8 | | 20 | | | |
| 9 | | 25 | | | |
| 10 | | 50 | | | |
| 11 | | 500 | | | |
| 12 | | 5000 | | | |
| 13 | | 10000 | | | |
| 14 | | 11000 | | | |
| 15 | | | 20 | | |
| 16 | | | 25 | | |
| 17 | | | 50 | | |
| 18 | | | 500 | | |
| 19 | | | 5000 | | |
| 20 | | | 10000 | | |
| 21 | | | 11000 | | |
| 22 | | | | 3 | |
| 23 | | | | 5 | |
| 24 | | | | 50 | |
| 25 | | | | 500 | |
| 26 | | | | 600 | |
| 27 | | | | | 3 |
| 28 | | | | | 5 |
| 29 | | | | | 50 |

TABLE 3-continued

| SAMPLE No. | ADDITIONAL ELEMENT (at ppm) | | | | |
|---|---|---|---|---|---|
| | Zn | Cd | Hg | P | S |
| 30 | | | | | 500 |
| 31 | | | | | 600 |
| 32 | 10 | 10 | | | |
| 33 | 100 | 100 | | | |
| 34 | 1000 | 1000 | | | |
| 35 | 5000 | 5000 | | | |
| 36 | 6000 | 6000 | | | |
| 37 | 10 | 10 | 10 | | |
| 38 | 100 | 100 | 100 | | |
| 39 | 1000 | 1000 | 1000 | | |
| 40 | 5000 | 5000 | 5000 | | |
| 41 | | | | 2 | 3 |
| 42 | | | | 5 | 5 |
| 43 | | | | 50 | 50 |
| 44 | | | | 100 | 100 |
| 45 | | | | 250 | 250 |
| 46 | | | | 250 | 300 |
| 47 | 10 | | | 2 | |
| 48 | 10 | 10 | | 2 | |
| 49 | | 10 | | 2 | 2 |
| 50 | 10 | | | 250 | 250 |
| 51 | 1000 | 1000 | | 200 | 200 |
| 52 | 1000 | 1000 | 10 | 200 | 200 |
| 53 | 2000 | 2000 | 2000 | 50 | 50 |
| 54 | 3000 | 3000 | 3000 | 50 | 50 |
| COMPARISON | | | | | |
| 55 | | Au (99.99) | | | |
| 56 | | Cu (99.9999) | | | |

By using the above samples, a pull test was carried out given times (n=40), and measurements were carried out for a pull strength, number of times of rupture of the base wire rather than the neck portion, condition of workability, and existence of chip crack. The result of the measurements for the high purity Pd and each Pd alloy is shown in Table 4.

TABLE 4

| SAMPLE No. | Pd | | | | Pd + Au (10 at %) | | | |
|---|---|---|---|---|---|---|---|---|
| | PULL STRENGTH (g) | C MODE RUPTURE (n = 40) | WORKA-BILITY | CHIP CRACK | PULL STRENGTH (g) | C MODE RUPTURE (n = 40) | WORKA-BILITY | CHIP CRACK |
| PREFERRED EMBODIMENT | | | | | | | | |
| 1 | 19.0 | 4 | GOOD | UNOBSERVED | 21.3 | 7 | GOOD | UNOBSERVED |
| 2 | 19.0 | 22 | " | " | 21.3 | 25 | " | " |
| 3 | 19.2 | 27 | " | " | 21.4 | 29 | " | " |
| 4 | 19.7 | 35 | " | " | 21.5 | 32 | " | " |
| 5 | 19.9 | 33 | " | " | 21.6 | 31 | " | " |
| 6 | 20.1 | 35 | " | " | 21.7 | 34 | " | " |
| 7 | 20.2 | 30 | BAD | " | 21.7 | 35 | BAD | OBSERVED |
| 8 | 19.0 | 5 | GOOD | " | 21.3 | 7 | GOOD | UNOBSERVED |
| 9 | 19.1 | 21 | " | " | 21.3 | 23 | " | " |
| 10 | 19.2 | 27 | " | " | 21.4 | 25 | " | " |
| 11 | 19.7 | 36 | " | " | 21.5 | 32 | " | " |
| 12 | 20.0 | 35 | " | " | 21.5 | 35 | " | " |
| 13 | 20.1 | 32 | " | " | 21.6 | 33 | " | " |
| 14 | 20.3 | 31 | BAD | " | 21.6 | 35 | BAD | OBSERVED |
| 15 | 19.1 | 4 | GOOD | " | 21.2 | 7 | GOOD | UNOBSERVED |
| 16 | 19.1 | 23 | " | " | 21.3 | 27 | " | " |
| 17 | 19.2 | 30 | " | " | 21.4 | 33 | " | " |
| 18 | 19.5 | 38 | " | " | 21.6 | 39 | " | " |
| 19 | 19.9 | 37 | " | " | 21.6 | 39 | " | " |
| 20 | 20.2 | 38 | " | " | 21.7 | 36 | " | " |
| 21 | 20.3 | 33 | BAD | UNOBSERVED | 21.7 | 35 | BAD | OBSERVED |
| 22 | 19.0 | 12 | GOOD | " | 21.3 | 10 | GOOD | UNOBSERVED |
| 23 | 19.1 | 21 | " | " | 21.3 | 21 | " | " |
| 24 | 19.3 | 33 | " | " | 21.4 | 29 | " | " |
| 25 | 19.6 | 37 | " | " | 21.5 | 35 | " | " |
| 26 | 19.7 | 35 | BAD | " | 21.6 | 35 | BAD | " |
| 27 | 19.0 | 10 | GOOD | " | 21.3 | 10 | GOOD | " |
| 28 | 19.2 | 22 | " | " | 21.3 | 20 | " | " |
| 29 | 19.3 | 30 | " | " | 21.3 | 27 | " | " |
| 30 | 19.6 | 36 | " | " | 21.4 | 32 | " | " |
| 31 | 19.7 | 37 | BAD | " | 21.5 | 36 | BAD | " |
| 32 | 19.1 | 6 | GOOD | " | 21.3 | 3 | GOOD | " |
| 33 | 19.2 | 22 | " | " | 21.4 | 23 | " | " |
| 34 | 19.3 | 28 | " | " | 21.5 | 29 | " | " |
| 35 | 20.1 | 35 | " | " | 21.6 | 32 | " | " |
| 36 | 20.3 | 36 | BAD | " | 21.6 | 34 | BAD | OBSERVED |
| 37 | 19.2 | 27 | GOOD | " | 21.4 | 28 | GOOD | UNOBSERVED |
| 38 | 19.5 | 38 | " | " | 21.5 | 37 | " | " |
| 39 | 19.8 | 37 | " | " | 21.5 | 37 | " | " |
| 40 | 20.4 | 33 | BAD | " | 21.6 | 36 | BAD | OBSERVED |
| 41 | 19.1 | 23 | GOOD | " | 21.3 | 21 | GOOD | UNOBSERVED |
| 42 | 19.3 | 29 | " | " | 21.3 | 32 | " | " |

TABLE 4-continued

| | | | | | | | | |
|---|---|---|---|---|---|---|---|---|
| 43 | 19.4 | 38 | " | " | 21.3 | 37 | " | " |
| 44 | 19.5 | 37 | " | " | 21.3 | 35 | " | " |
| 45 | 19.6 | 36 | " | " | 21.5 | 34 | " | " |
| 46 | 19.7 | 36 | BAD | UNOBSERVED | 21.5 | 35 | BAD | UNOBSERVED |
| 47 | 19.1 | 6 | GOOD | " | 21.3 | 7 | GOOD | " |
| 48 | 19.2 | 20 | " | " | 21.3 | 22 | " | " |
| 49 | 19.2 | 24 | " | " | 21.4 | 26 | " | " |
| 50 | 19.6 | 37 | BAD | " | 21.5 | 37 | BAD | " |
| 51 | 19.7 | 36 | GOOD | " | 21.6 | 35 | GOOD | " |
| 52 | 19.8 | 38 | BAD | " | 21.6 | 37 | BAD | " |
| 53 | 20.1 | 38 | GOOD | " | 21.6 | 38 | GOOD | " |
| 54 | 20.2 | 37 | BAD | " | 21.7 | 38 | BAD | OBSERVED |

COMPARISON — PULL STRENGTH (g)

| | |
|---|---|
| 55 | 12 |
| 56 | 21 |

| | Pd + Ag (5 at %) | | | | Pd + Mo (0.5 at %) | | | |
|---|---|---|---|---|---|---|---|---|
| SAMPLE No. | PULL STRENGTH (g) | C MODE RUPTURE (n = 40) | WORKA-BILITY | CHIP CRACK | PULL STRENGTH (g) | C MODE RUPTURE (n = 40) | WORKA-BILITY | CHIP CRACK |

PREFERRED EMBODIMENT

| | | | | | | | | |
|---|---|---|---|---|---|---|---|---|
| 1 | 21.5 | 6 | GOOD | UNOBSERVED | 20.0 | 8 | GOOD | UNOBSERVED |
| 2 | 21.5 | 22 | " | " | 20.1 | 26 | " | " |
| 3 | 21.5 | 30 | " | " | 20.1 | 29 | " | " |
| 4 | 21.6 | 33 | " | " | 20.2 | 32 | " | " |
| 5 | 21.7 | 34 | " | " | 20.5 | 34 | " | " |
| 6 | 21.7 | 34 | " | " | 20.6 | 31 | " | " |
| 7 | 21.8 | 32 | BAD | OBSERVED | 20.7 | 31 | BAD | OBSERVED |
| 8 | 21.5 | 6 | GOOD | UNOBSERVED | 20.0 | 8 | GOOD | UNOBSERVED |
| 9 | 21.5 | 21 | " | " | 20.0 | 25 | " | " |
| 10 | 21.6 | 27 | " | " | 20.1 | 34 | " | " |
| 11 | 21.6 | 33 | " | " | 20.2 | 37 | " | " |
| 12 | 21.7 | 37 | " | " | 20.6 | 36 | " | " |
| 13 | 21.7 | 34 | " | " | 20.6 | 33 | " | " |
| 14 | 21.8 | 36 | BAD | OBSERVED | 20.7 | 32 | BAD | OBSERVED |
| 15 | 21.4 | 5 | GOOD | UNOBSERVED | 20.0 | 10 | GOOD | UNOBSERVED |
| 16 | 21.5 | 22 | " | " | 20.0 | 26 | " | " |
| 17 | 21.6 | 28 | " | " | 20.2 | 34 | " | " |
| 18 | 21.7 | 36 | " | " | 20.3 | 37 | " | " |
| 19 | 21.7 | 37 | " | " | 20.5 | 36 | " | " |
| 20 | 21.7 | 34 | " | " | 20.6 | 33 | " | " |
| 21 | 21.8 | 31 | BAD | OBSERVED | 20.7 | 35 | BAD | OBSERVED |
| 22 | 21.5 | 9 | GOOD | UNOBSERVED | 20.0 | 13 | GOOD | UNOBSERVED |
| 23 | 21.5 | 20 | " | " | 20.1 | 24 | " | " |
| 24 | 21.5 | 31 | " | " | 20.2 | 37 | " | " |
| 25 | 21.5 | 36 | " | " | 20.4 | 38 | " | " |
| 26 | 21.6 | 33 | BAD | " | 20.4 | 36 | BAD | " |
| 27 | 21.5 | 12 | GOOD | " | 20.0 | 10 | GOOD | " |
| 28 | 21.5 | 21 | " | " | 20.0 | 22 | " | " |
| 29 | 21.5 | 28 | " | " | 20.1 | 30 | " | " |
| 30 | 21.6 | 31 | " | " | 20.3 | 36 | " | " |
| 31 | 21.6 | 35 | BAD | " | 20.4 | 38 | BAD | " |
| 32 | 21.5 | 3 | GOOD | " | 20.0 | 5 | GOOD | " |
| 33 | 21.5 | 24 | " | " | 20.1 | 25 | " | " |
| 34 | 21.6 | 30 | " | " | 20.4 | 33 | " | " |
| 35 | 21.7 | 33 | " | " | 20.6 | 37 | " | " |
| 36 | 21.8 | 35 | BAD | OBSERVED | 20.7 | 35 | BAD | OBSERVED |
| 37 | 21.5 | 30 | GOOD | UNOBSERVED | 20.1 | 31 | GOOD | UNOBSERVED |
| 38 | 21.6 | 35 | " | " | 20.1 | 39 | " | " |
| 39 | 21.6 | 36 | " | " | 20.3 | 38 | " | " |
| 40 | 21.8 | 33 | BAD | OBSERVED | 20.7 | 38 | BAD | OBSERVED |
| 41 | 21.5 | 22 | GOOD | UNOBSERVED | 20.1 | 25 | GOOD | UNOBSERVED |
| 42 | 21.5 | 28 | " | " | 20.0 | 33 | " | " |
| 43 | 21.5 | 36 | " | " | 20.2 | 38 | " | " |
| 44 | 21.5 | 38 | " | " | 20.2 | 38 | " | " |
| 45 | 21.5 | 37 | " | " | 20.4 | 37 | " | " |
| 46 | 21.5 | 36 | BAD | UNOBSERVED | 20.3 | 37 | BAD | UNOBSERVED |
| 47 | 21.5 | 7 | GOOD | " | 20.1 | 9 | GOOD | " |
| 48 | 21.5 | 21 | " | " | 20.1 | 24 | " | " |
| 49 | 21.5 | 25 | " | " | 20.1 | 28 | " | " |
| 50 | 21.5 | 36 | BAD | " | 20.3 | 33 | BAD | " |
| 51 | 21.6 | 36 | GOOD | " | 20.4 | 37 | GOOD | " |
| 52 | 21.6 | 38 | BAD | " | 20.4 | 38 | BAD | " |
| 53 | 21.7 | 39 | GOOD | " | 20.5 | 39 | GOOD | " |

TABLE 4-continued

| | | | | | | | | |
|---|---|---|---|---|---|---|---|---|
| 54 COMPARISON | 21.7 | 37 | BAD | OBSERVED | 20.6 | 39 | BAD | OBSERVED |
| | PULL STRENGTH (g) | | | C MODE RUPTURE (n = 40) | | | | |
| 55 | | 12 | | | | 2 | | |
| 56 | | 21 | | | | 2 | | |

| | Pd + Cu (5 at %) | | | |
|---|---|---|---|---|
| SAMPLE No. | PULL STRENGTH (g) | C MODE RUPTURE (n = 40) | WORKA-BILITY | CHIP CRACK |
| PREFERRED EMBODIMENT | | | | |
| 1 | 22.0 | 7 | GOOD | UNOBSERVED |
| 2 | 22.0 | 23 | " | " |
| 3 | 22.1 | 27 | " | " |
| 4 | 22.1 | 31 | " | " |
| 5 | 22.2 | 33 | " | " |
| 6 | 22.4 | 35 | " | " |
| 7 | 22.4 | 32 | BAD | OBSERVED |
| 8 | 22.0 | 4 | GOOD | UNOBSERVED |
| 9 | 22.1 | 23 | " | " |
| 10 | 22.1 | 29 | " | " |
| 11 | 22.2 | 29 | " | " |
| 12 | 22.3 | 34 | " | " |
| 13 | 22.4 | 33 | " | " |
| 14 | 22.4 | 35 | BAD | OBSERVED |
| 15 | 22.0 | 6 | GOOD | UNOBSERVED |
| 16 | 22.1 | 22 | " | " |
| 17 | 22.1 | 30 | " | " |
| 18 | 22.2 | 38 | " | " |
| 19 | 22.2 | 35 | " | " |
| 20 | 22.4 | 34 | " | " |
| 21 | 22.4 | 36 | BAD | OBSERVED |
| 22 | 22.0 | 11 | GOOD | UNOBSERVED |
| 23 | 22.0 | 23 | " | " |
| 24 | 22.0 | 32 | " | " |
| 25 | 22.1 | 35 | " | " |
| 26 | 22.1 | 33 | BAD | " |
| 27 | 22.0 | 9 | GOOD | " |
| 28 | 22.0 | 21 | " | " |
| 29 | 22.0 | 27 | " | " |
| 30 | 22.1 | 32 | " | " |
| 31 | 22.1 | 35 | BAD | " |
| 32 | 22.0 | 4 | GOOD | " |
| 33 | 22.0 | 22 | " | " |
| 34 | 22.1 | 30 | " | " |
| 35 | 22.4 | 35 | " | " |
| 36 | 22.4 | 33 | BAD | OBSERVED |
| 37 | 22.1 | 32 | GOOD | UNOBSERVED |
| 38 | 22.1 | 38 | " | " |
| 39 | 22.1 | 37 | " | " |
| 40 | 22.4 | 35 | BAD | OBSERVED |
| 41 | 22.0 | 24 | GOOD | UNOBSERVED |
| 42 | 22.0 | 30 | " | " |
| 43 | 22.0 | 35 | " | " |
| 44 | 22.0 | 36 | " | " |
| 45 | 22.1 | 37 | " | " |
| 46 | 22.1 | 37 | BAD | UNOBSERVED |
| 47 | 22.0 | 6 | GOOD | " |
| 48 | 22.0 | 23 | " | " |
| 49 | 22.0 | 27 | " | " |
| 50 | 22.1 | 37 | BAD | " |
| 51 | 22.1 | 37 | GOOD | " |
| 52 | 22.1 | 38 | BAD | " |
| 53 | 22.2 | 38 | GOOD | " |
| 54 | 22.3 | 39 | BAD | OBSERVED |
| COMPARISON | | C MODE RUPTURE (n = 40) | | |
| 55 | | 2 | | |
| 56 | | 2 | | |

As apparent from Table 4, it is appreciated that the number of times of C mode rupture in the pull test by using the samples according to the present invention is larger than that by using the samples in comparisons departing from the composition range according to the present invention, and that the neck portion is stronger than the other portion of the base wire. Accordingly, it is understood that the above-mentioned composition range according to the present invention is optimum.

In summary, the present invention has the following advantage.

(1) The bonding wire according to the first aspect of the present invention contains high purity Au or Au alloy as a base metal and 25–10000 atppm of low boiling point element I having a boiling point lower than a melting point of the base metal and soluble in Au, or contains high purity Au or Au alloy as a base metal and 5–500 atppm of low boiling point element II having a boiling point lower than a melting point of said base metal and insoluble in Au, or contains high purity Au or Au alloy as a base metal and 5–10000 atppm of a mixture of low boiling point element I having a boiling point lower than a melting point of the base metal and soluble in Au and low boiling point element II having a boiling point lower than the melting point of the base metal and insoluble in Au under the condition of (content of the low boiling point element I)/25 + (content of the low boiling point element II)/5 ≧ 1 ≧ (content of the low boiling point element I)/10000 + (content of the low boiling point element II)/500. Further, the bonding wire according to the second aspect of the present invention contains high purity Pd or Pd alloy as a base metal and 25–10000 atppm of low boiling point element III having a boiling point lower than a melting point of the base metal and soluble in Pd, or contains high purity Pd or Pd alloy as a base metal and 5–500 atppm of low boiling point element IV having a boiling point lower than a melting point of the base metal and insoluble in Pd, or contains high purity Pd or Pd alloy as a base metal and 5–10000 atppm of a mixture of low boiling point element III having a boiling point lower than a melting point of the base metal and soluble in Pd and low boiling point element IV having a boiling point lower than the melting point of the base metal and insoluble in Pd under the condition of (contempt of the low boiling point element III)/25 + (content of the low boiling point element IV)/5 ≧ 1 ≧ (content of the low boiling point element III)/10000 + (contempt of the low boiling point element IV)/500. With this constitution, the low boiling point element in the ball is vaporized and scattered upon formation of the ball to thereby prevent gas absorption peculiar to metal and obtain a ball satisfactory for bonding. On the other hand, the low boiling point element in the neck portion cannot be vaporized from the surface thereof, but it tends to be vaporized in the neck portion to generate a stress. Accordingly, a rupture strength of the neck portion after bonding is improved as compared with that of the base wire generating no stress. Accordingly, the strength of the neck portion can be made equal to or more than that of the base wire.

In comparison with the prior art wherein the strength of the neck portion becomes smaller than that of the base wire because of influence of heat upon formation of the ball, the bonding wire of the present invention does not generate a rupture of the neck portion, wire falling or wire sagging during the bonding work. Furthermore, in the temperature cycle life test of products, a stress generated by a repeated temperature change is dispensed to be absorbed in the whole of the base wire. Accordingly, the rupture of the neck portion where the rupture of the bonding wire is most frequently generated can be extremely reduced to thereby improve reliability.

(2) Since the rupture of the neck portion is hard to occur, the bonding wire can be greatly reduced in diameter to thereby enable reduction in bonding pitch and realize high-density mounting of LSI.

What is claimed is:

1. A bonding wire for a semiconductor device, said bonding wire consisting essentially of:
   high purity Pd or Pd alloy as a base metal; and
   25–10000 atppm of low boiling point element III, said low boiling point element III having a boiling point lower than a melting point of said base metal and being soluble in Pd, so that a neck portion produced with the bonding wire has a strength at least equal to a strength of the bonding wire.

2. The bonding wire according to claim 1, wherein said Pd alloy contains high purity Pd and at least one element selected from the group consisting of Au, Ag, Pt, Rh, Ru, Os, Ir, Cu, Mo, Fe and Ti, thereby providing a Pd alloy having high mechanical strength to enable high-speed bonding and prevention of enlargement of crystal grain in the neck portion upon formation of a ball.

3. The bonding wire according to claim 1, wherein said low boiling point element III includes at least one element selected from the group consisting of Zn, Cd, Hg, Li, Mg, Te and Yb.

4. The bonding wire according to claim 2, wherein said low boiling point element III includes at least one element selected from the group consisting of Zn, Cd, Hg, Li, Mg, Te and Yb.

5. A bonding wire for a semiconductor device, said bonding wire consisting essentially of:
   high purity Pd or Pd alloy as a base metal; and
   5–500 atppm of low boiling point element IV, wherein said element IV includes at least one element selected from the group consisting of P, S, As and Tl, and said element IV having a boiling point lower than a melting point of said base metal and being insoluble in Pd, so that a neck portion produced with the bonding wire has a strength at least equal to a strength of the bonding wire.

6. The bonding wire according to claim 5, wherein said Pd alloy contains high purity Pd and at least one element selected from the group consisting of Au, Ag, Pt, Rh, Ru, Os, Ir, Cu, Mo, Fe and Ti, so that a neck portion produced with the bonding wire has a strength at least equal to a strength of the bonding wire.

7. A bonding wire for a semiconductor device, said bonding wire consisting essentially of:
   high purity Pd or Pd alloy containing less than or equal to 10 at % of Au as a base metal;
   5–10000 atppm of low boiling point element III and low boiling point element IV, said low boiling point element III having a boiling point lower than a melting point of said base metal and being soluble in Pd, said low boiling point element IV having a boiling point lower than a melting point of said base metal and being insoluble in Pd, and said low boiling point element III and said low boiling point element IV being present in a concentration so that (content of said low boiling point element III)/25 + (content of said low boiling element IV)/5 ≧ 1 ≧ (content of said low boiling element III)/10000 + (content of said low boiling element IV)/500, so that a neck portion produced with the bonding wire has a strength at least equal to a strength of the bonding wire.

8. The bonding wire according to claim 7, wherein said Pd alloy contains high purity Pd and at least one element selected from the group consisting of Au, Ag, Pt, Rh, Ru, Os, Ir, Cu, Mo, Fe and Ti, so that a neck portion produced with the bonding wire has a strength at least equal to a strength of the bonding wire.

9. The bonding wire according to claim 7, wherein said low boiling point element III includes at least one element selected from the group consisting of Zn, Cd, Hg, Li, Mg, Te and Yb.

10. The bonding wire according to claim 8, wherein said low boiling point element III includes at least one element selected from the group consisting of Zn, Cd, Hg, Li, Mg, Te and Yb.

11. The bonding wire according to claim 7, wherein said low boiling point element IV includes at least one element selected from the group consisting of P, S, As and Tl.

12. The bonding wire according to claim 8, wherein said low boiling point element IV includes at least one element selected from the group consisting of P, S, As and Tl.

13. The bonding wire according to claim 9, wherein said low boiling point element IV includes at least one element selected from the group consisting of P, S, As and Tl.

* * * * *